(12) United States Patent
Matsumoto et al.

(10) Patent No.: US 7,797,664 B2
(45) Date of Patent: Sep. 14, 2010

(54) SYSTEM FOR CONFIGURING AN INTEGRATED CIRCUIT AND METHOD THEREOF

(75) Inventors: Yohei Matsumoto, Tsukuba (JP); Hanpei Koike, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 406 days.

(21) Appl. No.: 11/759,706

(22) Filed: Jun. 7, 2007

(65) Prior Publication Data

US 2007/0300201 A1 Dec. 27, 2007

(30) Foreign Application Priority Data

Jun. 23, 2006 (JP) ............................. 2006-173378
Jul. 27, 2006 (JP) ............................. 2006-204983

(51) Int. Cl.
*G06F 17/50* (2006.01)
(52) U.S. Cl. ................................. 716/16; 716/4; 716/17
(58) Field of Classification Search .................... 716/3, 716/4, 16–17
See application file for complete search history.

(56) References Cited

U.S. PATENT DOCUMENTS

| | | | |
|---|---|---|---|
| 6,064,225 A | 5/2000 | Andrews et al. | |
| 7,532,029 B1 * | 5/2009 | Asaduzzaman et al. | 326/38 |
| 2002/0157071 A1 * | 10/2002 | Schiefele et al. | 716/6 |
| 2003/0046643 A1 * | 3/2003 | Ohta et al. | 716/4 |
| 2003/0221056 A1 * | 11/2003 | Lee et al. | 711/114 |
| 2005/0138445 A1 * | 6/2005 | Ooneda et al. | 713/300 |
| 2007/0113123 A1 * | 5/2007 | Crouch et al. | 714/724 |

FOREIGN PATENT DOCUMENTS

| | | |
|---|---|---|
| JP | 63-70345 | 3/1988 |
| JP | 4-369120 | 12/1992 |
| JP | 11-330248 | 11/1999 |
| JP | 2000-286387 | 10/2000 |
| JP | 2004-020325 | 1/2004 |

* cited by examiner

Primary Examiner—Vuthe Siek
(74) Attorney, Agent, or Firm—Oblon, Spivak, McClelland, Maier & Neustadt, L.L.P.

(57) ABSTRACT

With respect to the reconfigurable integrated circuit, a system for configuring an integrated circuit and a configuration method thereof which do not need a circuit overhead for variation correction and diagnosis of variation are provided. A system for configuring an integrated circuit comprises a reconfigurable integrated circuit 101, a memory device for configuring 102 which holds a plurality of different circuit configurations to be realized on the reconfigurable integrated circuit, the circuit configurations having identical functions but having different performance depending on different probability variables, memory device for testing 103 which holds test data to be achieved by the circuit configuration for the respective function, and a test device 104 for performing a test based on the test data.

19 Claims, 10 Drawing Sheets

(a)

(b)

(a)

(b)

(c)

(a)

(b)

(c)

Path delay 76

Path delay 50

(a) ONE DIMENSIONAL ARRAY CONNECTED BY WIRE SEGMENTS WITH A LENGTH OF 2 (NOT-TORUS)

(b) ONE DIMENSIONAL TORUS ARRAY CONNECTED BY WIRE SEGMENTS WITH A LENGTH OF 1

(c) ONE DIMENSIONAL TORUS ARRAY CONNECTED BY WIRE SEGMENTS WITH A LENGTH OF 2

SYSTEM FOR CONFIGURING AN INTEGRATED CIRCUIT AND METHOD THEREOF

BACKGROUND OF THE INVENTION

1. Field of the Invention

The present invention is related to a reconfigurable integrated circuit, and more specifically related to a system for configuring an integrated circuit and a configuring method thereof to suppress reduction of performance yield due to process variation of semiconductors.

2. Discussion of the Background

In recent years, due to miniaturization of the semiconductor process, variation in the device characteristic in chips increases, and reduction in the performance yield becomes a problem. The performance yield is the number of chips capable of meeting the required performance divided by the number of chips produced. As for variation between chips (or variation having correlation over a wide range) it is effective to perform a correction after chip fabrication by controlling the threshold voltage of transistors by controlling the back bias, as described in the Non-Patent Document 1 and the Patent Document 1, 2. However, when uncorrelated variation occurs between chips, especially between transistors, it is necessary to reduce the granularity of bias control, which leads to a problem of increasing the circuit overhead.

On the other hand, a different approach can be taken to the reconfigurable integrated circuit such as FPGAs (field-programmable gate array), wherein the circuit function can be changed as many times as needed after fabricating chips.

FIG. 1 shows a typical example of a structure of a reconfigurable integrated circuit, and FIG. 1(a) shows a tile of the reconfigurable integrated circuit and FIG. 1(b) shows a tile array thereof.

The reconfigurable integrated circuit is typically constructed such that a tile 1 containing a programmable switch matrix 3 and a functional block 2 is arranged as a tile array 6 shown in FIG. 1, and tiles are connected by a vertical and horizontal interconnection channels 5, 4, respectively.

In other words, the reconfigurable integrated circuit is composed of regularly arranged programmable functional blocks and programmable interconnecting network connecting the functional blocks mutually. The interconnecting network and the functional blocks can change their connection topologies and functions by a configuring memory.

As a configuring memory, a volatile memory such as a SRAM (static random access memory) and a DRAM (dynamic random access memory) and a non-volatile memory such as a flash EEPROM (electronically erasable and programmable read only memory), a MRAM (magnetic random access memory) and a FeRAM (ferroelectric random access memory) can be used, and a configuring memory utilizing a SRAM or a flash EEPROM is currently most used.

Generally a user describes a required function using a function description language such as a HDL (Hardware description language) or a programming language, generates information to determine a function of the reconfigurable integrated circuit using a mapping tool (or a compiler), and loads the information into a configuring memory of the reconfigurable integrated circuit, thereby realizing a desired function on the reconfigurable integrated circuit. Besides, a process of assigning the function described by the user to a plurality of functional blocks of the reconfigurable integrated circuit is referred to as a mapping, and a tool to perform the process automatically is referred to as a mapping tool.

Among the reconfigurable integrated circuits, there are a fine-grain reconfigurable integrated circuit such as a FPGA which can change the circuit configuration as a unit of a gate, a coarse-grain reconfigurable integrated circuit which can change the circuit configuration as a unit of ALU (arithmetic logic unit) or a multiplier, and their mixture reconfigurable integrated circuit. A dynamic reconfigurable integrated circuit which includes a plurality of configuring memories capable of instantaneous switching and realizes a plurality of circuit functions in time division manner on a single reconfigurable integrated circuit by switching over the configuring memories is also a kind of the reconfigurable integrated circuit.

One of the easiest configuring methods of avoiding variation in such reconfigurable integrated circuits is a method that variation is measured in advance and a circuit element having good characteristics is assigned to the most critical part determining the performance of the circuit. Important things to realize the method of avoiding the variation in such a reconfigurable integrated circuit are diagnosis of variation in each chip (to examine what characteristic each circuit element has) and mapping by taking the variation into account.

The diagnosis of variation of the reconfigurable integrated circuit can be performed by configuring a measurement circuit for device characteristics such as a ring oscillator on the reconfigurable integrated circuit. However, this method takes long time to evaluate variation in fine-grain and has difficulty of corresponding to the uncorrelated variation in transistors.

Although it is considered possible to evaluate variation more quickly by integrating a circuit for evaluating variation in advance into a reconfigurable integrated circuit, the diagnosis of variation in fine-grain is still difficult because of large circuit overhead and variation in the detection circuit itself.

The difficulty in failure diagnosis has been conventionally considered one of the factors to increase cost because the number of possible circuit states is extremely large in the reconfigurable integrated circuit. The diagnosis of variation is a still more difficult problem because it requires detecting analog values instead of digital values as in the failure diagnosis. Therefore the addition of the diagnosis of variation to the fabrication process of the reconfigurable integrated circuit results in a large increase in cost.

Also, besides the problem that performing a mapping separately on the respective chip takes an extremely long time to fabricate a product mounting the chip, there exists another problem of the stability of an automatic mapping tool. It is difficult for the algorithm of the automatic mapping tool to give stably an optimal solution. Performing a mapping separately on the respective chip results in reduction of performance since an increase in performance margin is required by taking the instability of solution into account.

[Patent document 1] Japanese Patent Application 2000-286387.

[Patent document 2] Japanese Patent Application 2004-20325.

[Non-Patent document 1] D. R. Ditzel, "Power Reduction using LongRun2 in Transmeta's Efficieon Processor" Spring Processor Forum Presentation, 2006.

The purpose of the present invention is to provide a system for configuring an integrated circuit and a configuring method thereof of the reconfigurable integrated circuit which do not need circuit overhead for variation correction and diagnosis of variation.

SUMMARY OF THE INVENTION

To achieve the purpose described above, the present invention includes following arrangements.

[1] A system for configuring an integrated circuit comprising a reconfigurable integrated circuit, a memory device for configuring which holds a plurality of different circuit configurations to be realized on the reconfigurable integrated circuit, the circuit configurations having identical functions but having different performance depending on different probability variables, a memory device for testing which holds test data to be achieved by the circuit configuration for the respective function, and a test device for performing a test based on the test data.

[2] The system for configuring an intergrated circuit described in [1], wherein the reconfigurable intergrated circuit, the memory device for configuring, the memory device for testing and the test device comprise a mutually communicating means.

[3] The system for configuring an integrated circuit described in [1] or [2] furthermore comprising a memory device for circuit control which holds operating information of the reconfigurable integrated circuit corresponding to the circuit configuration, and a circuit control device which controls operation of the reconfigurable integrated circuit based on the operation information corresponding to the circuit configuration for the respective function being held in the memory device for circuit control.

[4] The system for configuring an integrated circuit described in [3], wherein the circuit control device comprises at least one clock signal generator capable of generating clock signals with a plurality of frequencies to supply the reconfigurable integrated circuit with at least one clock signal, and at least one voltage generator capable of generating multiple voltage values to supply the reconfigurable integrated circuit with at least one electric source.

[5] The system for configuring an integrated circuit described in [3], wherein the memory device for circuit control holds a set of clock frequencies to supply to respective clock terminals of the reconfigurable integrated circuit corresponding to respective functions, and holds a set of voltage values to supply to the respective power terminal of the reconfigurable integrated circuit corresponding to the respective function.

[6] The system for configuring an integrated circuit described in [3], wherein, when a circuit configuration for a given function is loaded into the reconfigurable integrated circuits, the circuit control device controls output voltages of the voltage generator based on the set of the voltage values corresponding to the function and held by the memory device for circuit control.

[7] The system for configuring an integrated circuit described in [4], comprising at least one clock signal generator capable of generating clock signals with a plurality of frequencies or one voltage generator capable of generating multiple voltage values, wherein the memory device for circuit control has a set n of the clock frequencies and the voltage values corresponding to the information indicating the operation state such as a power consumption or a current consumption or their derivatives of at least one partial circuit of the reconfigurable integrated circuit in operation, and the circuit control device controls respective clock signal generator or voltage generator according to the set n of the clock frequencies and voltage values corresponding to the operation state.

[8] The system for configuring an integrated circuit described in [7], wherein, when a circuit configuration is loaded into the reconfigurable integrated circuit, by operating the reconfigurable integrated circuit at the clock frequency which the circuit configuration requires according to the memory device for circuit control and the circuit control device, and by confirming the validity of an input-output vector by the memory device for testing and the test device, the circuit configuration is confirmed to be able to operate at the specified clock frequency.

[9] The system for configuring an integrated circuit described in [1], [2] or [3], wherein the test data is information about allowable power consumption for the circuit configuration for a respective function.

[10] The system for configuring an integrated circuit described in [1], [2] or [3], wherein the memory device for testing holds at least a set of an input vector and a correct output vector for a respective function, and the test device confirms that the correct output vector corresponding to the input vector in the memory device corresponds with an output vector obtained by inputting the input vector to the reconfigurable integrated circuit.

[11] A method for configuring an integrated circuit comprising the steps of generating a plurality of different circuit configurations to be realized on the reconfigurable integrated circuit, the circuit configurations having identical functions but having different performance depending on different probability variables, testing respective circuit configuration, and selecting a circuit configuration, which can operate with desired performance for the reconfigurable integrated circuit, from the plurality of circuit configurations.

[12] The method for configuring an integrated circuit described in [11], furthermore comprising a step of removing ineffective circuit configurations from the memory device for configuring.

[13] The method for configuring an integrated circuit described in [11], furthermore comprising a step of removing all effective circuit configurations except one from the memory device for configuration.

[14] The method for configuring an integrated circuit described in [11], furthermore comprising a step of selecting a circuit configuration which achieves target power consumption.

[15] The method for configuring an integrated circuit described in [11], futhermore comprising a step of selecting a circuit configuration which achieves a target circuit speed.

[16] The method for configuring an integrated circuit described in [15], furthermore comprising a step of confirming that a target circuit speed is achieved by confirming validity of the input-output vector when the reconfigurable integrated circuit configured with the circuit configuration is operated at a target clock frequency.

[17] The method for configuring an integrated circuit described in [11], furthermore comprising a step of generating a plurality of circuit configurations so that for arbitrary two circuit configurations among a plurality of circuit configurations having identical functions, circuit elements used on a critical path on the reconfigurable integrated circuit differ from circuit elements used on the other critical path.

[18] The method for configuring an integrated circuit described in [11], wherein at least a part of the interconnection between array of the basic tile of which the reconfigurable integrated circuit is composed is connected in a n-dimensional torus (n is an integer more than or equal to one).

[19] The method for configuring an integrated circuit described in [11], wherein a horizontal or vertical interconnection between an array of the basic tile of which the reconfigurable integrated circuit is composed is connected in a n-dimensional torus (n is an integer more than or equal to one).

[20] The method for configuring an integrated circuit described in [11], wherein in an array of a sub array of the basic tile of which the reconfigurable integrated circuit is composed, a part or the entirety of the sub array is connected in a torus in a n-dimensional torus (n is an integer more than or equal to one).

[21] The method for configuring an integrated circuit described in [20], wherein horizontal or vertical direction between the sub array is connected in a torus.

[22] The method for configuring an integrated circuit described in any one of [18] to [21], wherein an array or a sub array connected in a torus is connected by wire segments with logical length of more than or equal to two.

[23] The method for configuring an integrated circuit described in [18] or [19], wherein a plurality of different circuit configurations to be realized on the reconfigurable integrated circuit, the circuit configurations having identical functions but having different performance depending on different probability variables, is generated by moving a circuit configuration along the direction of connection in a torus of an array of the basic tile.

[24] The method for configuring an integrated circuit described in [20] or [21], wherein a plurality of different circuit configurations to be realized on the reconfigurable integrated circuit, the circuit configurations having identical functions but having different performance depending on different probability variables is generated by moving a circuit configuration along the direction of connection in a torus in every sub array.

DESCRIPTION OF THE PREFERRED EMBODIMENTS

Figure 2:
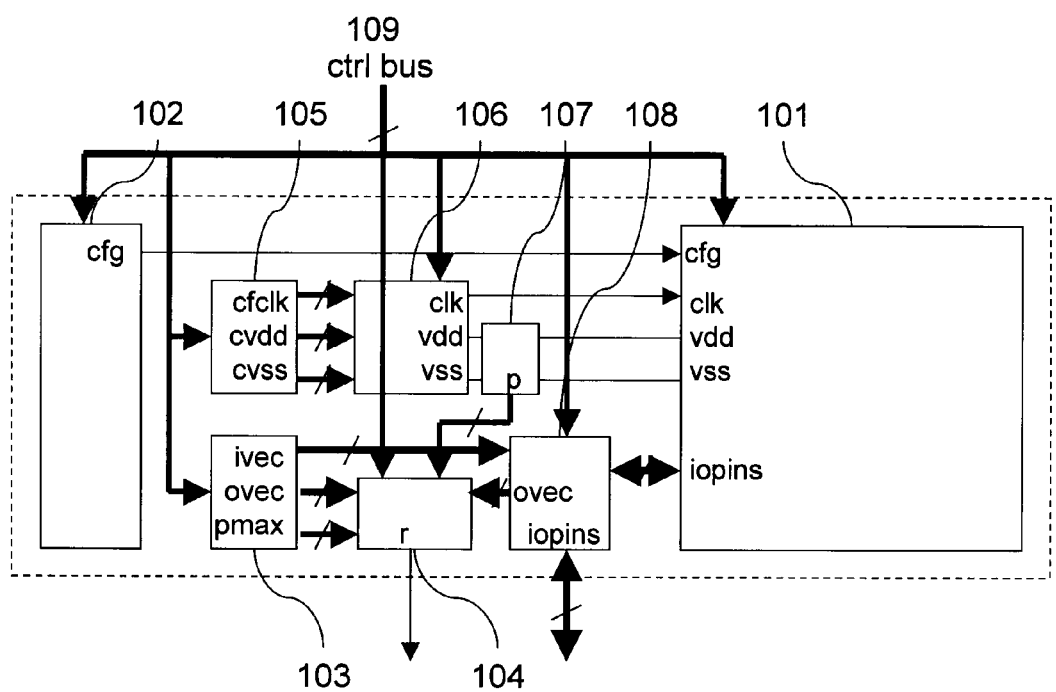
FIG. 2 is a block diagram of a system for configuring integrated circuit according to an embodiment of the present invention.

FIG. 2 is a block diagram of a system for configuring an integrated circuit according to an embodiment of the present invention.

As an embodiment, FIG.2 shows a block diagram of a system for configuring an integrated circuit comprising a reconfigurable integrated circuit 101, a memory device for configuring 102 which holds a plurality of circuit configurations, a memory device for testing 103 which holds a test data, a test device 104 which performs a test based on the test data, a memory device for circuit control 105 which holds operation conditions of the reconfigurable integrated circuit 101, a circuit control device 106 which controls the reconfigurable integrated circuit 101 based on the operation conditions, a measurement device 107 for measuring power consumption of the reconfigurable integrated circuit 101, and an interface device 108 capable of switching the connection of TO of the reconfigurable integrated circuit 101 between the test circuit side and an external system for configuring an integrated circuit side.

Besides, it is assumed that a test for the logic function of the circuit configuration which is held by the memory device for configuring 102 has been completed in advance. Furthermore, the test data is to confirm that desired power consumption and operation speed are obtained when the circuit configuration is applied to operate the reconfigurable integrated circuit 101, and it is assumed here that the data contains information about the allowable power consumption and test vectors (consisting of an input vector and an output vector). That the circuit configuration satisfies the desired operation speed is judged by validity of an output vector for the test vector inputted to the reconfigurable integrated circuit 101 operated at a desired clock frequency. The test vector is one satisfactorily capable of confirming that the circuit configuration meets the requirement of the power consumption and operating speed.

In the present system for configuring an integrated circuit, when an external system sets a new circuit configuration to the reconfigurable integrated circuit 101, each of the devices are controlled in the following procedure through a control bus (ctrl bus shown in FIG. 2) 109.

(1) Through the control bus 109 the external system loads a plurality of different circuit configurations realizing identical functions into the memory device for configuring 102, information on a clock frequency and an operating voltage to operate the circuit configuration into the memory device for circuit control 105, and information on an allowable power consumption and a test vector in a case of operating the circuit configuration into the memory device for testing 103.

[2] The circuit control device 106 generates a clock signal with frequency determined based on a cfclk signal of the memory device for circuit control 105 and supplies the clock signal to a clk terminal of the reconfigurable integrated circuit 101, and generates a source voltage determined based on a cvdd signal and a cvss signal of the memory device for circuit control 105 and supplies the source voltage to Vdd and Vss terminals, respectively, of the reconfigurable integrated circuit 101.

(3) Through the control bus 109, the external system transfers one of the circuit configurations held by the memory device for configuring 102 to the reconfigurable integrated circuit 101, and sets the function to the reconfigurable integrated circuit 101.

(4) The interface device 108 is switched to the test device 104 side to make the input vector (an ivec terminal of the memory device for testing 103 shown in FIG. 2) held by the memory device for testing 103 applicable to pins used as input pins among the input/output pins iopins of the reconfigurable integrated circuit 101, and the interface device 108 is furthermore switched to connect the test device 104 to pins used as output pins among the input/output pins iopins of the reconfigurable integrated circuit 101 (connect to an ovec terminal side of the interface device 108 shown in FIG. 2).

(5) The memory device for testing 103 inputs the input vector to the reconfigurable integrated circuit 101, and the test device 104 compares the obtained output vector with the reasonable output vector held in the memory device for testing 103. If there is a disagreement, the test device 104 informs the external system by a r-signal of the result that the given circuit configuration cannot be operated at the required clock frequency.

(6) After a power consumption of the reconfigurable integrated circuit 101 is measured by the measurement device 107 for power consumption during the testing procedure described in (5), and if the allowable power consumption held by the memory device for testing 103 is not satisfied, the test device 104 informs the external system by the r-signal of the result that the power consumption condition is not satisfied.

(7) When it is judged by the r-signal of the test device 104 that the circuit configuration selected in the above description (1) does not satisfy the desired operation speed and power consumption, another circuit configuration is designated, and the procedure described in (1) is repeated.

(8) When it is judged by the r-signal of the test device 104 that the circuit configuration selected in the above description (1) satisfies the desired operation speed and power consumption, the circuit configuration is set as an effective circuit configuration, and the interface device 108 switches the input/output of the reconfigurable integrated circuit 101 to the external system side.

The present configuring method enables to improve the performance yield by preparing a plurality of circuit configurations having identical functions but having different performance depending on different probability variables, and by doing a test, and by making use of a circuit configuration capable of meeting the required performance.

A distribution function of the circuit performance when a given circuit configuration is loaded to the reconfigurable integrated circuit 101 is expressed by f(X), wherein X is a vector representing performance parameters such as circuit delay and power consumption. When the required performance is expressed by $X_{target}$, then the performance yield $Y_{performance}$ is expressed by the following equation.

$$Y_{performance} = \int^{Xtarget} f(X) dX$$

On the other hand, if it is possible to generate different N circuit configurations performance thereof depends on probability variables which are independent with each other, and to select a circuit configuration satisfying the required performance, $Y_{performance}$ can then be expressed by the following equation.

$$Y_{performance} = 1 - [1 - \int^{Xtarget} f(X) dX]^N$$

In other words, if N=1 and $Y_{performance} < 1$, it is possible to reduce markedly the loss rate of the chip by increasing N. On the other hand, circuit configurations performance thereof depends on independent probability variables are, in other words, circuit configurations to be realized on the reconfigurable integrated circuit 101 in such a way that a respective critical path does not use the same function circuit as others. Since the critical path in a circuit typically does not occupy much resource on the reconfigurable integrated circuit, it is easy to generate a plurality of circuit configurations performance thereof depends on independent probability variables as described above by displacing each of the critical path from others.

The present system for configuring an integrated circuit is different from the conventional and typical system for configuring an integrated circuit including a reconfigurable integrated circuit, and requires (1) test device 104 which performs a test based on test data, (2) memory device for configuring 102 which holds a plurality of different circuit configurations realizing a function on the reconfigurable integrated circuit 101, and (3) memory device for testing 103 which holds test data for the circuit configuration with a respective function to achieve. However, these devices can be shared with the devices with similar function used for other purposes included in the system including the system for configuring an integrated circuit, or to be shared between a plurality of reconfigurable integrated circuits 101. Thus an increase in cost by providing the system for configuration an integrated circuit can be suppressed.

For example, a product including a reconfigurable integrated circuit in recent year is in many cases, connected to a software system or has a software sub system. In such a case, it is possible to realize the function of the devices (1) to (3) as described above as software. In this case it is not necessary to specially provide the product with the devices (1) to (3) described above, and it is also possible to suppress the increase in cost caused by providing the system for configuring an integrated circuit. Furthermore, in a case where the frequency of re-configuring the reconfigurable integrated circuit included in the product is low, a circuit configuration satisfying the required performance is selected by dividing the system for configuring an integrated circuit into a sub system on the product side and a sub system on the manufacturer side, by providing a communication interface on both sides, by arranging the devices (1) to (3) described above on the sub system on the manufacturer side, and by connecting the sub system on the product side to the sub system on the manufacturer side when required. In this way the devices (1) to (3) described above can be shared between products, and omitted from the sub system on the product side, thereby enabling to reduce the cost.

The test with respect to a specific circuit configuration is much easier than diagnosing failure and variation in a physical parameter by examining all sub circuits of the reconfigurable integrated circuit. Also, the present configuration method does not need many voltage generators, power supply buses, variation detection circuits, voltage selection circuits and the like which would be necessary when a correction of variation of threshold voltage in transistors by back bias control is carried out with fine-grain. Furthermore, because the diagnosis of variation is not required, circuits for diagnosis of variation are not necessary. Moreover, when a mapping is performed by taking variation into account, the mapping must be performed individually for each chip, while in the present method, mapping and test are required to be carried out only as many times as the number of the circuit configurations prepared.

Therefore there is no problem such as time consumption in fabrication of the product including the reconfigurable integrated circuit.

The present method and system work more effectively by preparing a much higher number of circuit configurations stably. In the following, a specific construction of the reconfigurable integrated circuit which can assist the generation of circuit configurations will be described.

The present invention provides an integrated circuit capable of realizing a plurality of circuit configurations simply by configuring a circuit configuration once by mapping tool and a method for generating the circuit configuration thereof.

In the following, a reconfigurable integrated circuit is configured by taking the above description into account.

Figure 3:
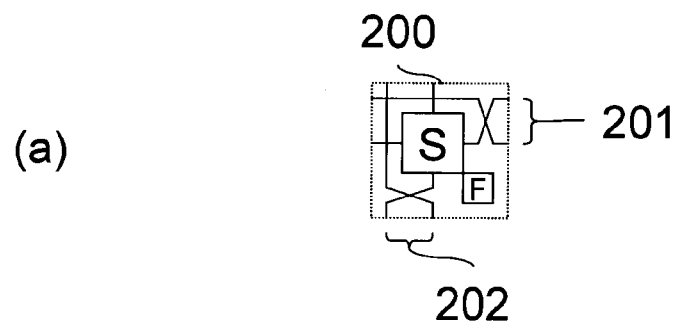
FIG. 3 is an example of a tile array of the reconfigurable integrated circuit connected in a two-dimensional torus.
Figure 3:
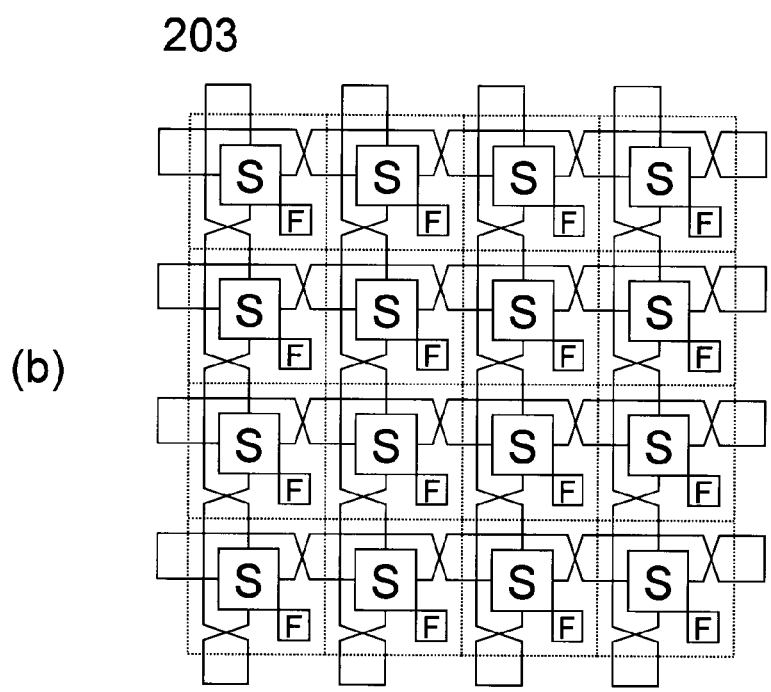
Figure 3:
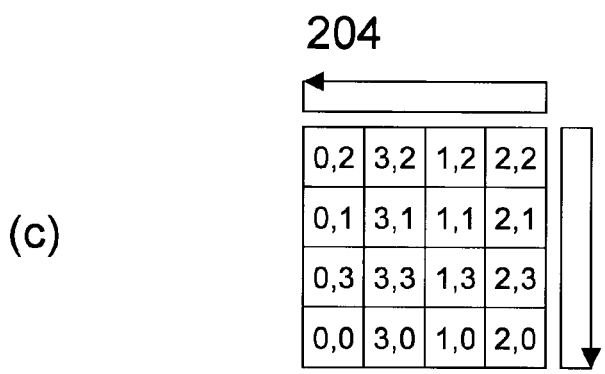

FIG. 3 is a diagram showing an example of a tile array of reconfigurable integrated circuits connected in a two-dimensional torus. FIG. 3(a) shows a tile of a reconfigurable integrated circuit, FIG. 3(b) shows a tile array thereof, and FIG. 3(c) shows their coordinates.

In FIG. 3, to ensure that the probabilistic performance (performance distribution) does not change after moving a circuit configuration, it is necessary to bury the two-dimensional torus in a two-dimensional surface to make the length of connection between tiles adjoining logically with each other uniform all over the torus surface. Therefore, in an axial direction of the two-dimensional surface, the tiles are arranged every other in their order on the torus surface, and when an end is reached, then from the other direction the tiles are arranged at the position skipped before in their order on the torus surface. Here, refer to the coordinate 204 of FIG. 3(c).

Besides, an important feature in fabrication of the array type reconfigurable integrated circuit has the advantage that it can be realized only by arranging identical tiles. Also the reconfigurable integrated circuit having the interconnection with a two-dimensional torus has a feature that it can easily be realized by simply arranging the tile 200 as a tile array 203 and by connecting them by interconnection channel with the end thereof to be looped.

Figure 1:
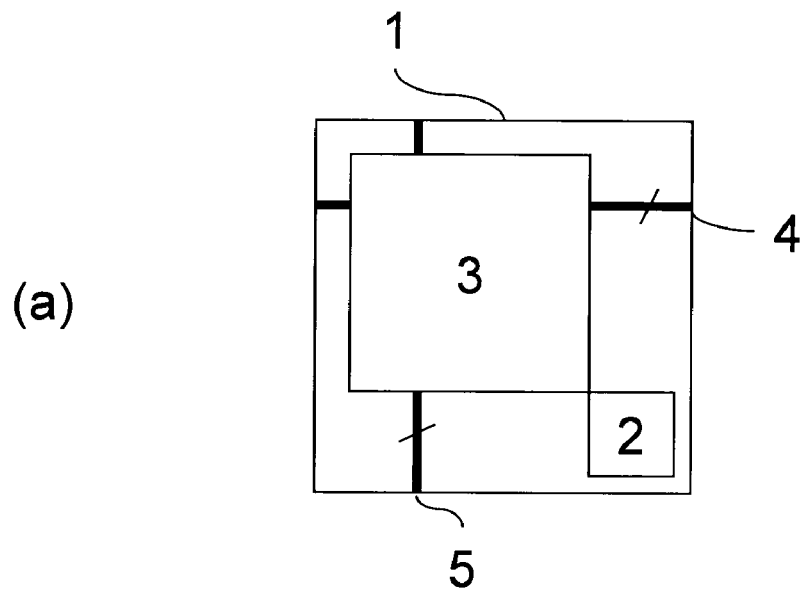
FIG. 1 is a typical example of a structure of a reconfigurable integrated circuit.
Figure 1:
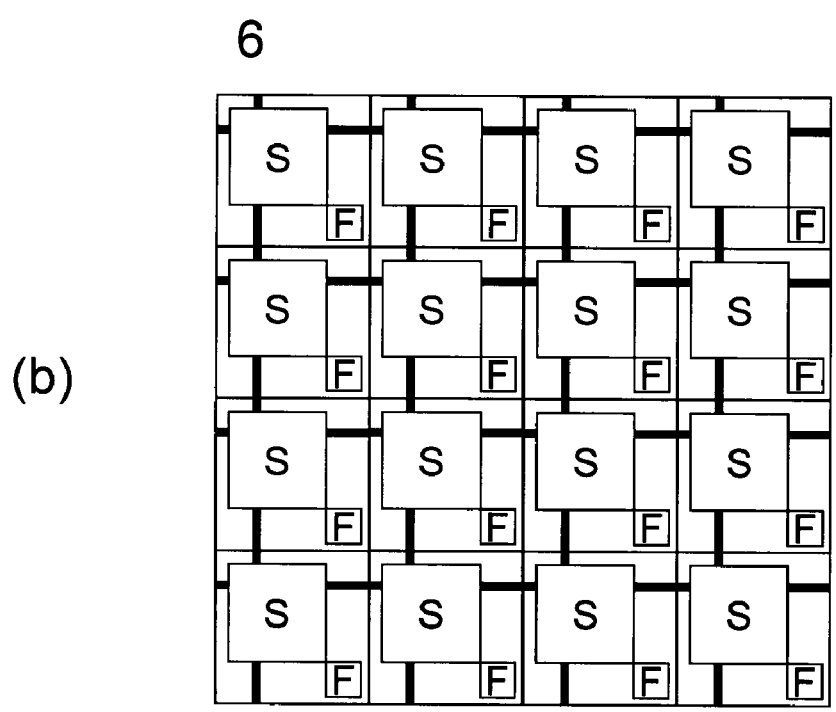

As compared with the construction shown in FIG. 1, the construction shown in FIG. 3 seems to need twice as many numbers of the horizontal direction interconnection channel 201 and the vertical direction interconnection channel 202. But this is cancelled out by the effect of the torus interconnection which makes the total interconnection length half. Moreover, a physical length between the adjoining tiles is considered to become twice as long as that in the construction shown in FIG. 1 (in reality because numbers of switches become half, and the area of tiles decreases due to the torus interconnection, the physical length becomes less than twice). However, since a principal factor for the path delay in such a reconfigurable integrated circuit is a delay due to a switch, an increase in delay due to elongation of the metallic interconnection by a factor of two is only a few percent. Rather, the maximum path delay decreases because the maximum number of stages for passing switches becomes half by taking the torus.

On the other hand, when moving a circuit configuration within a torus plane, there might be an inconvenience that a position of an IO pad of a chip and an input/output position of a circuit are changed significantly. To avoid this problem, it is possible to introduce the interconnection with the torus into a part of an array to limit the area in which the circuit configuration can be moved.

Figure 4:
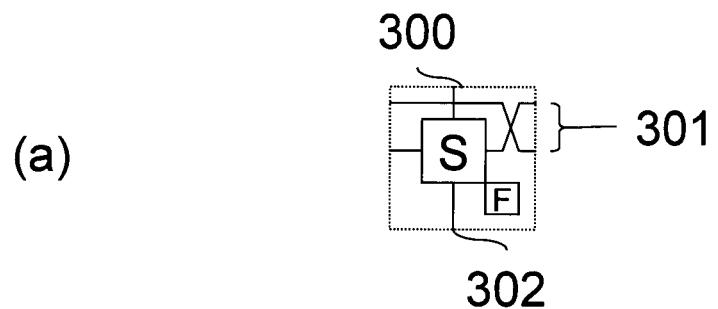
FIG. 4 is an example of a tile array of the reconfigurable integrated circuit connected in a torus only in the horizontal direction.
Figure 4:
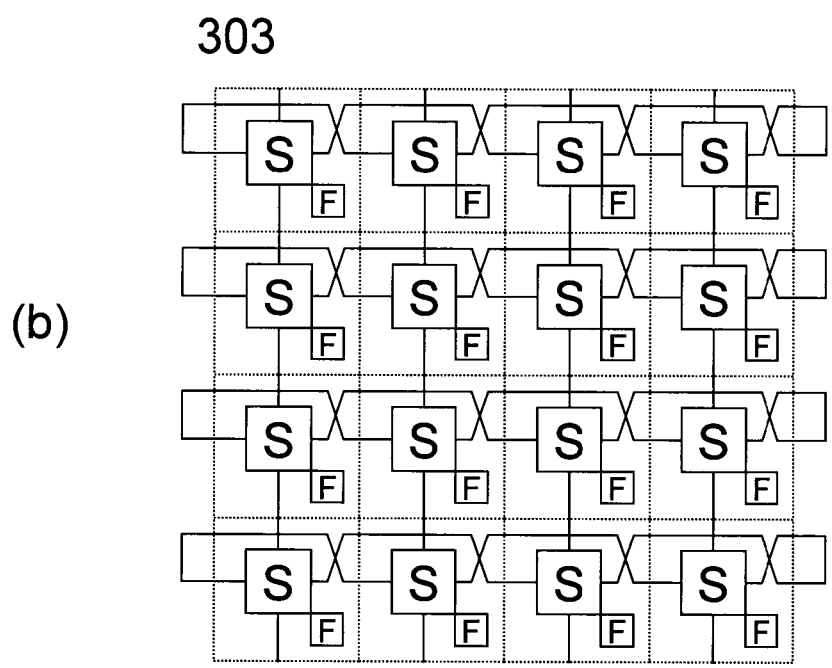
Figure 4:
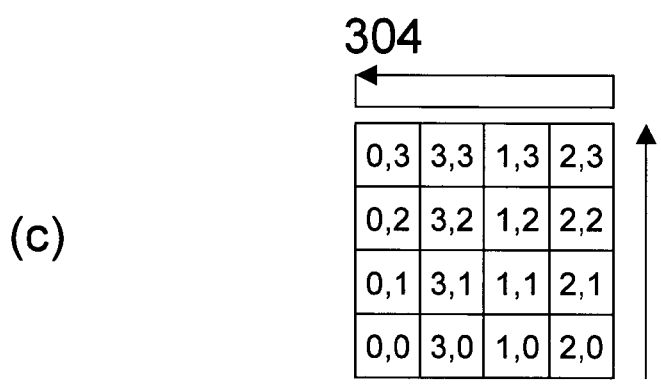

FIG. 4 is an example of a tile array of the reconfigurable integrated circuit with a torus interconnection only in the horizontal direction. FIG. 4(a) is a tile of the reconfigurable integrated circuit, FIG. 4(b) is a tile array thereof, and FIG. 4(c) is the coordinate thereof.

In FIG. 4, 300 indicates a tile of the reconfigurable integrated circuit, wherein the interconnection channel in the horizontal direction 301 is doubled, the same as is shown in FIG. 3, while the interconnection channel in the vertical direction 302 is single, the same as the interconnection channel shown in FIG. 1 (Besides, each interconnection channel is composed of a plurality of interconnection tracks.) A tile array 303 is formed by arranging tiles 300, which are connected by the interconnection channel with the horizontal ends thereof to be looped. The coordinate system 304 is the same as that shown in FIG. 3 in the horizontal direction, and the same as that shown in FIG. 1 in the vertical direction. In this construction a circuit configuration is movable only in the horizontal direction. As compared with the case of the two-dimensional torus, the number of the different circuit configurations obtainable by movement is reduced to the square root in this case, but the movement of the position of the input/output of the circuit can be restricted to be in the horizontal direction.

Figure 5:
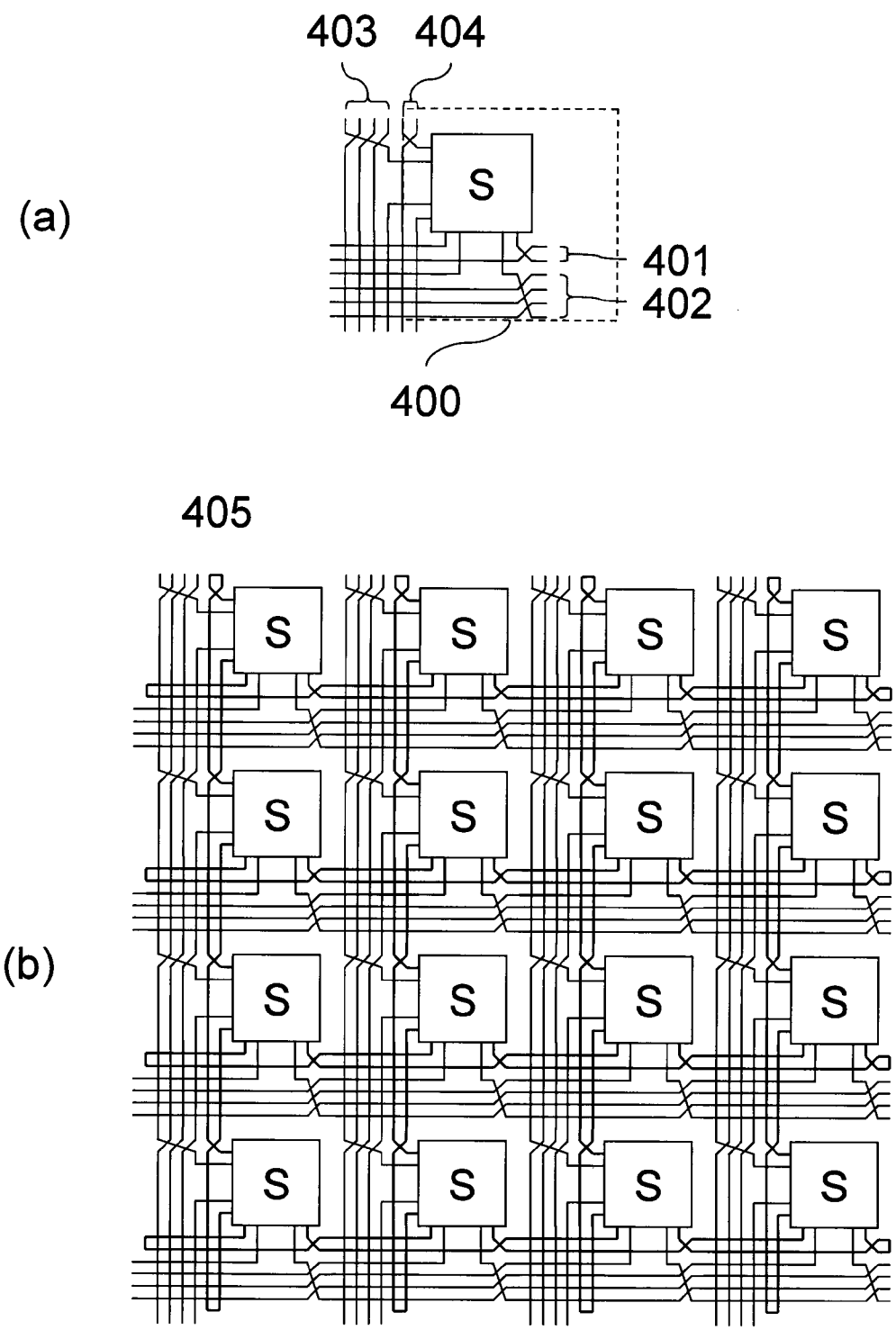
FIG. 5 is an example of a tile array forming a sub array of the reconfigurable integrated circuit connected in a two-dimensional 4×4 torus.
Figure 6:
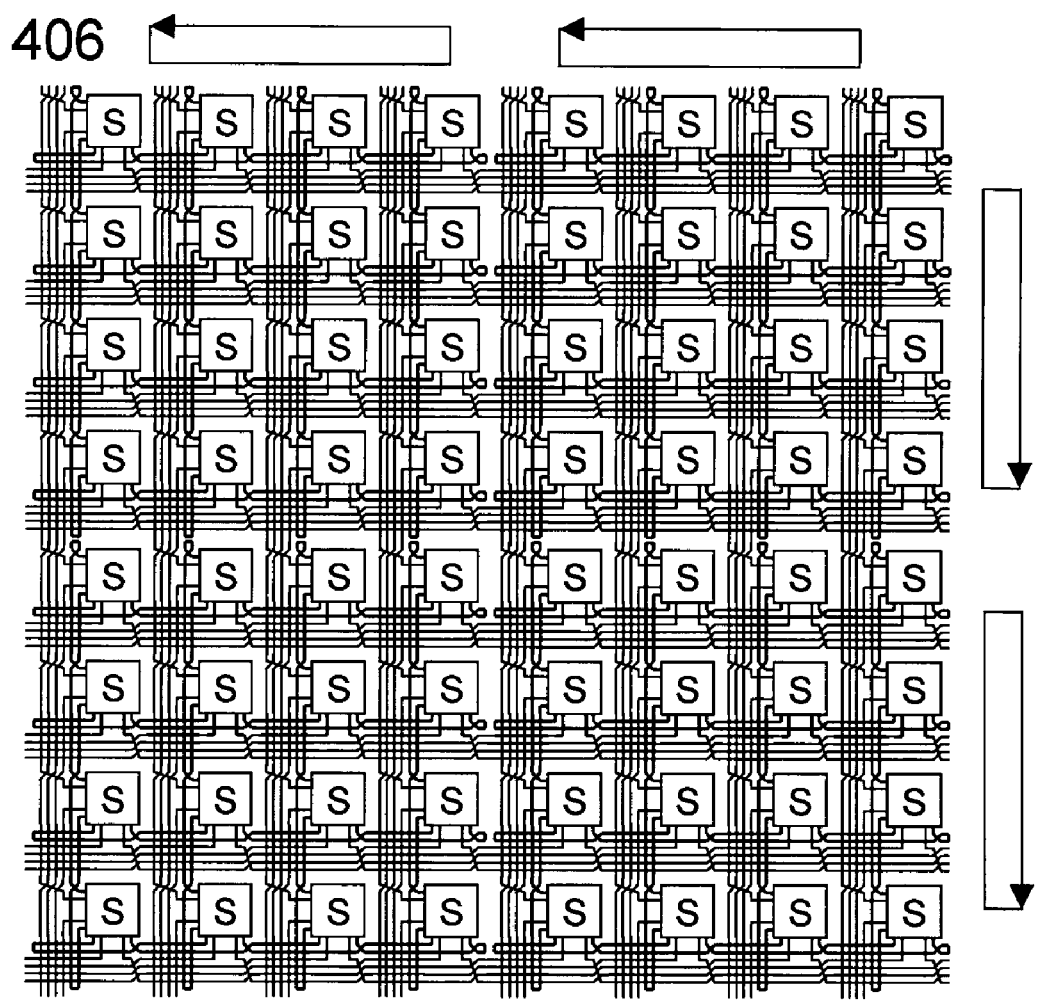
FIG. 6 is an example of a tile array arranging a sub array 405 in 2×2.

FIG. 5 is an example of a tile array forming a sub array of the reconfigurable integrated circuit connected in a two-dimensional 4×4 torus. FIG. 5(a) is a tile of the reconfigurable integrated circuit, and FIG. 5(b) shows a sub array thereof. FIG. 6 is an example of the entirety of a tile array arranging the sub arrays in a 2×2 form.

As shown in FIG. 5, it is also possible to form a sub array, the interior of which is connected in a torus (the functional blocks are omitted in FIG. 5). In the tile 400, reference numerals 401, 404 are interconnections within the sub array, and 402 and 403 show interconnection channels for connecting between the sub arrays. When the tiles 400 are arranged in a 4×4 form to construct the sub array 405, the tiles 400 are connected by the interconnections within the sub array 401, 404 looped at the ends of the sub array 405. By arranging furthermore these sub arrays 405 into, for example, a 2×2 form, the entirety of array 406 is formed (refer to FIG. 6). In this construction, the circuit configuration is adapted to move the circuit within each of the sub array simultaneously in the same direction. By this arrangement, the number of different circuit configurations realizable by movement reduces to the number of tiles in the sub array, but movement area of the input/output of the circuit can also be limited within the area of the sub array.

Also for the construction shown in FIG. 5, interconnection which has the torus topology only in the horizontal direction within the sub array similar to the construction shown in FIG. 4 can be considered.

The feasibility of the construction shown in FIGS. 3 to 5 depends on a tradeoff between the IO latency and the correction ability of the variation, and changes depending on the IO latency which the main usage of the reconfigurable integrated circuit requires. But in many cases, the IO latency does not become a problem because delay due to IO pads is much larger than the interconnection delay within the chip.

Figure 7:
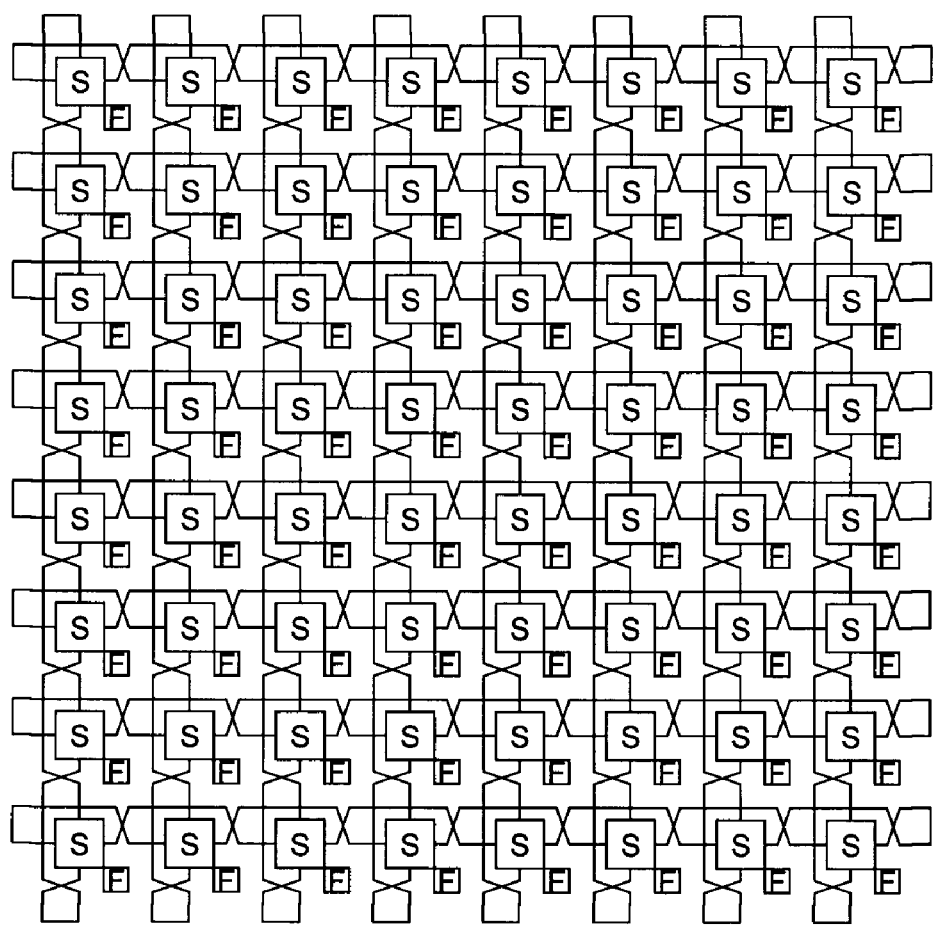
FIG. 7 is an example of two-dimensional 8×8 torus tile array.
Figure 8:
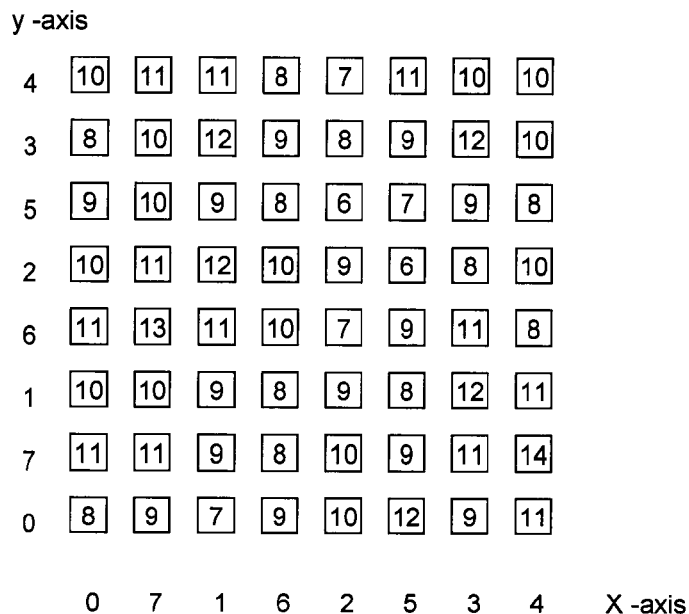
FIG. 8 is an example of delay of a switch matrix of each tile in the two-dimensional 8×8 torus tile array.
Figure 9:
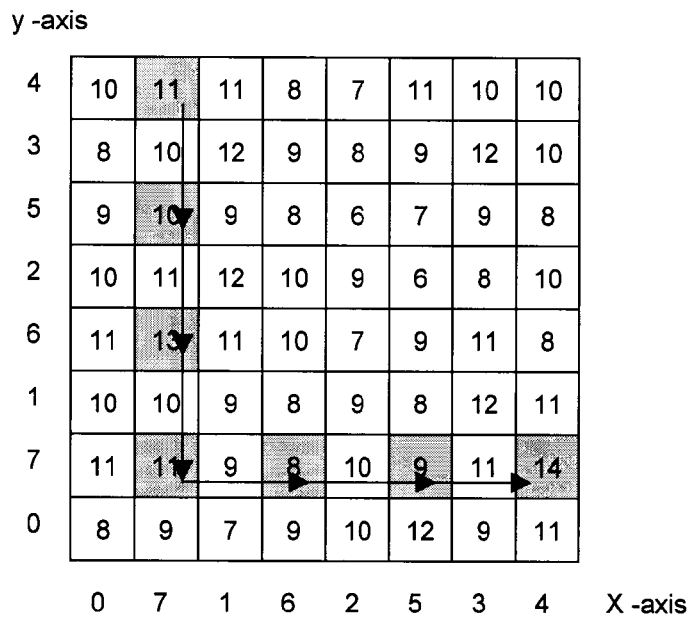
FIG. 9 is an example of a delay path in the two-dimensional 8×8 torus tile array having delay as shown in FIG. 8.
Figure 10:
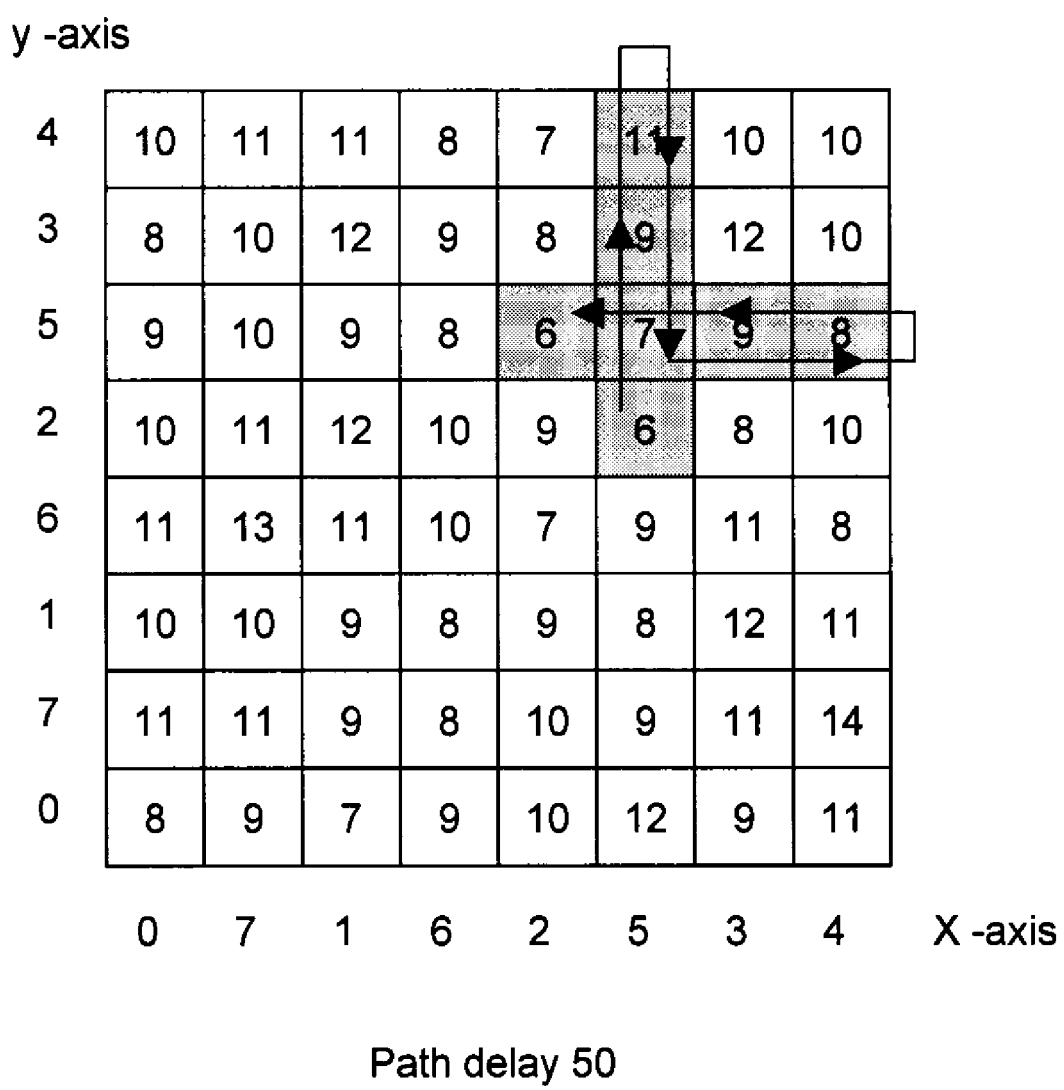
FIG. 10 is an example of a delay path realized by parallel translation of the delay path shown in FIG. 8 by −2 both in the x and y directions.

FIG. 7 is an example of a two-dimensional 8×8 torus tile array, that is, a reconfigurable integrated circuit connected in a two-dimensional torus. FIG. 8 is an example of delay of a switch matrix of each tile in the two-dimensional 8×8 torus tile array. FIG. 9 is an example of a delay path in the two-dimensional 8×8 torus tile array having the delay as shown in FIG. 8. FIG. 10 is an example of a delay path realized by parallel translation of the delay path shown in FIG. 8 by −2 both in the x and y directions.

Here it is assumed that the delay times for a signal to pass through each switch matrix shown in FIG. 7 are varied, for example, as shown in FIG. 8 (the numerals indicated in each square shown in FIG. 8 express the delay time of each switch matrix.). In this case, if the critical path which determines the performance of the circuit passes through 7 stages of the switch matrix as shown in FIG. 9, the delay time is 76.

On the other hand, if the entirety of the circuit is parallel translated by −2 in x and y directions respectively within the torus surface, the path shown in FIG. 9 is moved to the position shown in FIG. 10, then the delay time reduces to 50 and the variation is avoided.

In other words, when a circuit configuration is generated by the automatic mapping tool, a plurality of circuit configurations having the identical performance distribution depending on different probability variable can easily be generated by moving the circuit configuration within the torus surface. Furthermore, the plurality of generated circuit configurations can be tested according to the invention shown in FIG. 2, and a circuit configuration in a position satisfying the required performance can be utilized, thereby improving the performance yield.

Also in the reconfigurable integrated circuit in recent years, connection is performed in general by interconnections having a plurality of segment lengths in order to reduce delay due to passing through the switch matrix.

Figure 11:
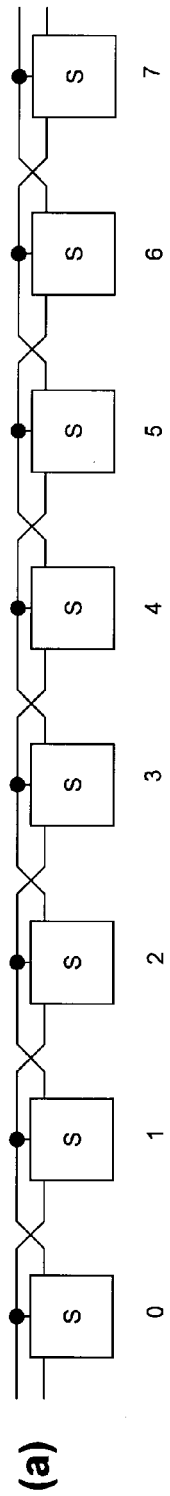
FIG. 11 is an example of an array having wire segments with a plurality of lengths.
Figure 11:
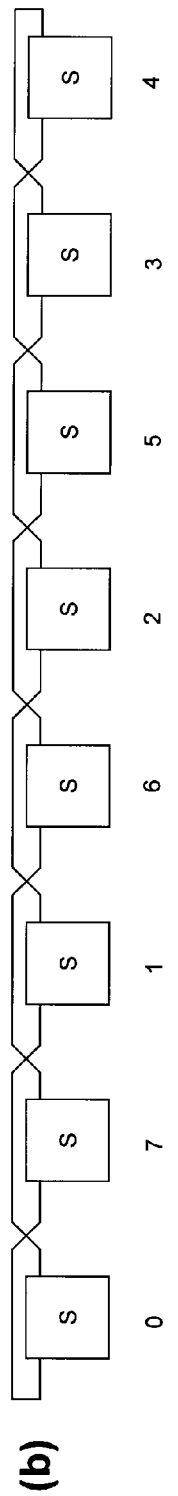
Figure 11:
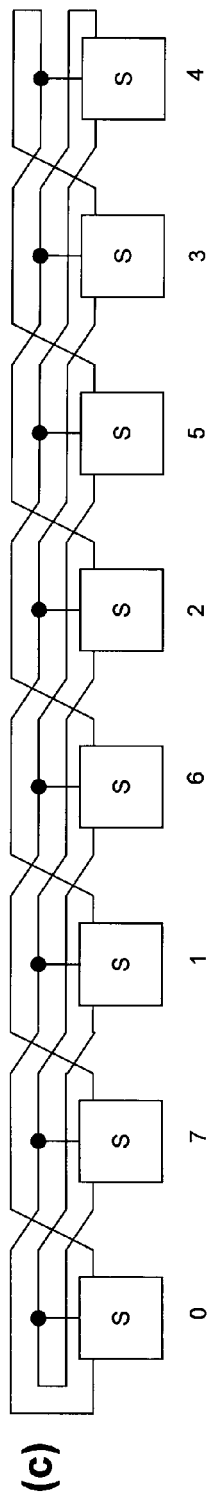

FIG. 11 is an example of an array having wire segments with a plurality of lengths. FIG. 11(a) shows a one-dimensional array (non-torus) connected by wire segments of length 2. FIG. 11(b) shows a one-dimensional torus array connected by wire segments of length 1. FIG. 11(c) shows a one-dimensional torus array connected by wire segments of length 2.

Although not shown in FIG. 11(a), a two-dimensional array can easily be realized by connecting an array in the vertical direction similarly to the interconnection in the horizontal direction shown in FIG. 11(a). Also a connection using wire segments of length of more than or equal to 2 can be easily realized.

A wire segment of length 2 is an interconnection connecting every other switch matrix of a tile. Apparently a one-dimensional array connected by wire segments of length 2 looks similar to a one-dimensional array connected in a torus (See FIG. 11(b)), but they differ in that the interconnections need to return at the end of the array, and a connection from an inner point of the wire segment to a switch matrix is not necessary in the case of the torus. Generally, the connection from an inner point of the wire segment to a switch matrix is required to ensure connection between arbitrary two functional blocks.

On the other hand, the connection in the torus can also be realized by using wire segments of a plurality of lengths. The distance between tiles on the torus surface is referred to as a logical distance. FIG. 11(c) shows a one-dimensional torus array configured by wire segments of the logical length 2. Since the one-dimensional torus is buried in a line, the logical length 2 corresponds to a physical length 4. A wire segment starting from a tile with a coordinate x in the torus is always connected to a tile with (x+2)mod a (array size), and at the end of the array the interconnection returns with a loop to keep this relationship. In FIG. 11(c), only a case of a one-dimensional torus with wire segments of the logical length of 2 is shown. In the two-dimensional array, a case with longer wire segments can also easily be realized. Longer wire segment can also be applied to a construction having a partial torus connection as shown in FIG. 4 and FIG. 5.

According to the present invention, since a part of the array is connected by an interconnection with a torus, and each connection is performed by wire segments of a uniform length, the circuit configuration after movement within the torus surface has always a performance distribution which is identical to that of the circuit configuration before movement. Since the position of the critical path (signal path to determine the performance) of the circuit configuration on the reconfigurable integrated circuit is changed by movement, the performance of the circuit configuration after movement depends on a different probability variable from the performance of the original circuit configuration. Therefore, once a circuit configuration is set by the automatic mapping tool, as many target circuit configurations as movable numbers can be realized.

According to the present invention, the following advantages can be obtained.

(1) The test with respect to a specific circuit configuration is much easier as compared with diagnosing failure and variation in physical parameters by examining all over the partial circuit of the reconfigurable integrated circuit.

(2) Many voltage generators, power supply buses, variation detection circuits, voltage selection circuits, and the like which are necessary when a fine-grain correction of variation in threshold voltage of transistors is carried out by controlling back biases become unnecessary.

(3) Because a diagnosis of variation is not required, circuits for the diagnosis of variation are also not required. While individual mapping for each chip is necessary for carrying out a mapping by taking the variation into account, the mapping necessary in the present invention is required only as many times as the number of the prepared circuit configurations and therefore suppresses a problem of time consumption in fabrication of products including a reconfigurable integrated circuit.

The present invention can be utilized in a system LSI having a reconfigurable integrated circuit such as FPGA as a core as well as main application fields thereof such as mobile terminals, digital home electronics, communication apparatus, server, storage, super computer.

The invention claimed is:

1. A system for configuring an integrated circuit comprising:
    a reconfigurable integrated circuit,
    a memory device for configuring which holds a plurality of different circuit configurations to be realized on the reconfigurable integrated circuit, the circuit configurations having identical functions but having different performance depending on different probability variables,
    a memory device for testing which holds test data to be achieved by the circuit configurations for respective functions,
    a test device for performing a test based on the test data,
    a memory device for circuit control which holds operating information of the reconfigurable integrated circuit corresponding to the circuit configuration,
    a circuit control device which controls operation of the reconfigurable integrated circuit based on the operation information corresponding to the circuit configurations for the respective functions being held by the memory device for circuit control, the circuit control device comprising:
        at least one clock signal generator capable of generating clock signals with a plurality of frequencies to supply the reconfigurable integrated circuit with at least one clock signal, and at least one voltage generator capable of generating multiple source voltage values to supply the reconfigurable integrated circuit with at least one source voltage value, wherein the reconfigurable integrated circuit, the memory device for configuring, the circuit control device, the memory device for testing and the test device comprise a mutually communicating means.

2. The system for configuring an integrated circuit according to claim 1, wherein the memory device for circuit control holds a set of clock frequencies to supply to respective clock terminal of the reconfigurable integrated circuit corresponding to respective function, and holds a set of voltage values to supply to the respective power terminal of the reconfigurable integrated circuit corresponding to the respective function.

3. The system for configuring an integrated circuit according to claim 1, wherein, when a circuit configuration for a given function is loaded into the reconfigurable integrated circuit, the circuit control device controls output voltages of the voltage generator based on the set of the voltage values corresponding to the function and held by the memory device for circuit control.

4. The system for configuring an integrated circuit according to claim 1, comprising at least one clock signal generator capable of generating clock signals with a plurality of frequencies or one voltage generator capable of generating multiple voltage values, wherein the memory device for circuit control has set n of the clock frequencies and the voltage values corresponding to the information indicating the operation state such as a power consumptions or a current consumptions or their derivatives of at least one partial circuit of the reconfigurable integrated circuit in operation, and the circuit control device controls respective clock signal generator or voltage generator according to the set n of clock frequencies and voltage values corresponding to the operation state.

5. The system for configuring an integrated circuit according to claim 4, wherein, when a circuit configuration is loaded into the reconfigurable integrated circuit, by operating the reconfigurable integrated circuit at the clock frequency which the circuit configuration requires according to the memory device for circuit control and the circuit control device, and by confirming the validity of an input-output vector by the memory device for testing and the test device, the circuit configuration is confirmed to be able to operate at the specified clock frequency.

6. The system for configuring an integrated circuit according to claim 1, wherein the test data is information about allowable power consumption for the circuit configuration for respective function.

7. The system for configuring an integrated circuit according to claim 1, wherein the memory device for testing holds at least a set of an input vector and a correct output vector for respective function, and the test device confirms that the correct output vector corresponding to the input vector in the memory device corresponds with an output vector obtained by inputting the input vector to the reconfigurable integrated circuit.

8. A method for configuring an integrated circuit comprising:

loading a plurality of different circuit configurations to be realized on a reconfigurable integrated circuit into a memory device for configuring, the circuit configurations having identical functions but having different performance depending on different probability variables, loading test data to be achieved by the circuit configurations for respective functions into a memory device for testing, loading operating information of the reconfigurable integrated circuit corresponding to the circuit configurations into a memory device for circuit control, controlling operation of the reconfigurable integrated circuit based on the operation information, generating a clock signal and a source voltage value, supplying the clock signal and the source voltage value to the reconfigurable integrated circuit, testing respective circuit configurations based on the test data, and selecting a circuit configuration, which can operate with desired performance for the reconfigurable integrated circuit, from the plurality of circuit configurations.

9. The method for configuring an integrated circuit according to claim 8, furthermore comprising a step of selecting a circuit configuration which achieve a target power consumption.

10. The method for configuring an integrated circuit according to claim 8, furthermore comprising a step of selecting a circuit configuration which achieve a target circuit speed.

11. The method for configuring an integrated circuit according to claim 10, furthermore comprising a step of confirming that the target circuit speed is achieved by confirming validity of an input-output vector when the reconfigurable integrated circuit configured with the circuit configuration is operated at a target clock frequency.

12. The method for configuring an integrated circuit according to claim 8, furthermore comprising a step of generating a plurality of circuit configurations so that for arbitrary two circuit configurations among a plurality of circuit configurations having identical functions, circuit elements used on a critical path on the reconfigurable integrated circuit differ from circuit elements used on the other critical path.

13. The method for configuring an integrated circuit according to claim 8, wherein at least a part of an interconnection between array of the basic tile of which the reconfigurable integrated circuit is composed is connected in a n-dimensional torus (n is an integer more than or equal to one).

14. The method for configuring an integrated circuit according to claim 8, wherein horizontal or vertical interconnection between array of the basic tile of which the reconfigurable integrated circuit is composed is connected in a n-dimensional torus (n is an integer more than or equal to one).

15. The method for configuring an integrated circuit according to claim 13 or 14, wherein a plurality of different circuit configurations to be realized on the reconfigurable integrated circuit, the circuit configurations having identical functions but having different performance depending on different probability variables is generated by moving a circuit configuration along the direction of connection in a torus of an array of the basic tile.

16. The method for configuring an integrated circuit according to claim 8, wherein in an array of a sub array of the basic tile of which the reconfigurable integrated circuit is composed, a part or the entirety of the sub array is connected in a n-dimensional torus (n is an integer more than or equal to one).

17. The method for configuring an integrated circuit according to claim 16, wherein horizontal or vertical direction between the sub array is connected in a torus.

18. The method for configuring an integrated circuit according to any one of claims 13 to 17, wherein an array or a sub array connected in a torus is connected by wire segments with logical length of more than or equal to two.

19. The method for configuring an integrated circuit according to claim 16 or 17, wherein a plurality of different circuit configurations to be realized on the reconfigurable integrated circuit, the circuit configurations having identical functions but having different performance depending on different probability variables is generated by moving a circuit configuration along the direction of connection in a torus in every sub arrays.

* * * * *